United States Patent
Ando et al.

(10) Patent No.: US 9,608,066 B1
(45) Date of Patent: Mar. 28, 2017

(54) HIGH-K SPACER FOR EXTENSION-FREE CMOS DEVICES WITH HIGH MOBILITY CHANNEL MATERIALS

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Vijay Narayanan, New York, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/869,282

(22) Filed: Sep. 29, 2015

(51) Int. Cl.
  *H01L 29/10* (2006.01)
  *H01L 29/51* (2006.01)
  *H01L 29/66* (2006.01)
  *H01L 27/00* (2006.01)
  *H01L 27/092* (2006.01)

(52) U.S. Cl.
  CPC ........ *H01L 29/1033* (2013.01); *H01L 27/092* (2013.01); *H01L 29/517* (2013.01); *H01L 29/518* (2013.01); *H01L 29/66492* (2013.01); *H01L 29/66553* (2013.01)

(58) Field of Classification Search
  CPC . H01L 29/1033; H01L 29/517; H01L 29/518; H01L 29/66492; H01L 29/66553; H01L 27/092
  See application file for complete search history.

(56) References Cited

U.S. PATENT DOCUMENTS

| | | | | |
|---|---|---|---|---|
| 5,256,586 A * | 10/1993 | Choi | ................ | H01L 21/28167 257/336 |
| 5,274,261 A * | 12/1993 | Chen | ................... | H01L 29/4232 257/344 |
| 5,290,720 A * | 3/1994 | Chen | ................ | H01L 21/82383 257/328 |
| 5,411,906 A * | 5/1995 | Johnson | ............ | H01L 21/28105 257/344 |
| 5,710,054 A * | 1/1998 | Gardner | .............. | H01L 21/2256 257/E21.15 |

(Continued)

OTHER PUBLICATIONS

Ohta, H. et al., "Novel Thin Sidewall Structure for High Performance Bulk CMOS with Charge-Assisted Source-Drain-Extension," Symposium on VLSI Technology Digest of Technical Papers, Jun. 2007. (pp. 120-121).

(Continued)

*Primary Examiner* — Ida M Soward
(74) *Attorney, Agent, or Firm* — Tutunjian & Bitetto, P.C.; Vazken Alexanian (57) ABSTRACT

A field effect transistor device includes a gate structure formed over a channel region in a semiconductor material. An inner spacer is formed on sidewalls of the gate structure and over an extension region of the semiconductor material. The inner spacer includes charge or dipoles. A source/drain region is formed adjacent to the gate structure. An inversion layer is formed in the extension region induced by the inner spacer to form a conductive link between the channel region and the source/drain region.

15 Claims, 6 Drawing Sheets

(56) References Cited

U.S. PATENT DOCUMENTS

| | | | |
|---|---|---|---|
| 5,714,413 A * | 2/1998 | Brigham | H01L 29/0847 257/E21.431 |
| 5,736,446 A * | 4/1998 | Wu | H01L 21/2254 257/E21.148 |
| 5,759,901 A * | 6/1998 | Loh | H01L 21/26586 438/217 |
| 5,811,342 A * | 9/1998 | Wu | H01L 21/266 148/DIG. 106 |
| 5,817,562 A * | 10/1998 | Chang | H01L 21/76897 257/E21.507 |
| 5,841,168 A * | 11/1998 | Gardner | H01L 29/7835 257/344 |
| 5,895,238 A * | 4/1999 | Mitani | H01L 29/0847 257/344 |
| 5,952,702 A * | 9/1999 | Gardner | H01L 29/6656 257/324 |
| 5,989,966 A * | 11/1999 | Huang | H01L 29/6659 257/E21.149 |
| 6,043,545 A * | 3/2000 | Tseng | H01L 21/28052 257/336 |
| 6,144,071 A * | 11/2000 | Gardner | H01L 29/4983 257/344 |
| 6,157,064 A * | 12/2000 | Huang | H01L 29/6659 257/334 |
| 6,180,988 B1 * | 1/2001 | Wu | H01L 21/2257 257/346 |
| 6,187,636 B1 * | 2/2001 | Jeong | H01L 21/28273 257/E21.209 |
| 6,187,645 B1 * | 2/2001 | Lin | H01L 21/28035 257/E21.197 |
| 6,194,272 B1 * | 2/2001 | Sung | H01L 21/28273 257/E21.422 |
| 6,501,134 B1 | 12/2002 | Krivokapic | |
| 6,680,233 B2 | 1/2004 | Yu et al. | |
| 6,990,022 B2 * | 1/2006 | Morikawa | G11C 16/0475 257/E21.21 |
| 7,095,077 B2 * | 8/2006 | Kataoka | H01L 21/28282 257/314 |
| 7,492,006 B2 * | 2/2009 | Buh | H01L 21/28194 257/327 |
| 7,696,036 B2 | 4/2010 | Bu et al. | |
| 8,035,173 B2 | 10/2011 | Bu et al. | |
| 8,481,383 B2 * | 7/2013 | Ohta | H01L 21/82386 257/190 |
| 8,674,429 B2 | 3/2014 | Yun et al. | |
| 9,029,959 B2 | 5/2015 | Brodsky et al. | |
| 9,034,703 B2 | 5/2015 | Cheng et al. | |
| 2007/0272974 A1 * | 11/2007 | King | H01L 27/115 257/324 |
| 2008/0293199 A1 * | 11/2008 | Lin | G11C 16/0466 438/261 |
| 2011/0068416 A1 | 3/2011 | Son | |
| 2015/0041868 A1 | 2/2015 | Cheng et al. | |

OTHER PUBLICATIONS

Takagi, S., et al., "Carrier-Transport-Enhanced Channel CMOS for Improved Power Consumption and Performance," IEEE Transactions on Electron Devices, vol. 55, No. 1, Jan. 2008. (pp. 21-38).

* cited by examiner

HIGH-K SPACER FOR EXTENSION-FREE CMOS DEVICES WITH HIGH MOBILITY CHANNEL MATERIALS

BACKGROUND

Technical Field

The present invention relates to high mobility channel devices, and more particularly to devices and methods for forming complementary metal oxide semiconductor (CMOS) devices without extension doping below gate structures.

Description of the Related Art

High mobility channel devices are useful in high speed applications, such as, e.g., communications and high speed computing. Due to their high speed operation, defects in high mobility devices have a larger impact on device function. To ensure proper operation, in one example, low temperature processes (less than 650 degrees C.) need to be employed due to thermal instability of channel materials. The low temperature regimes limit dopant diffusion to/from the channel. In addition, extension dopant processes to extend the channel under spacer structures employ higher temperature implantation steps that may cause collateral damage and undesirable diffusion. Further, if source/drain (S/D) junctions are formed with an in-situ doped epitaxial process, it is difficult to link the S/D region to the channel due to the presence of spacer structures, which protect the gate during the epitaxial process.

SUMMARY

A field effect transistor device includes a gate structure formed over a channel region in a semiconductor material. An inner spacer is formed on sidewalls of the gate structure and over an extension region of the semiconductor material. The inner spacer includes charge or dipoles. A source/drain region is formed adjacent to the gate structure. An inversion layer is formed in the extension region induced by the inner spacer to form a conductive link between the channel region and the source/drain region.

Another field effect transistor device includes a complementary metal oxide semiconductor (CMOS) device having a first semiconductor material for forming n-type field effect transistors (NFETs) and a second semiconductor material for forming p-type field effect transistors (PFETs). The first and second semiconductor materials are formed from different materials on a same substrate. Gate structures are formed over channel regions in the first and second semiconductor materials. First inner spacers are formed on sidewalls of the gate structures of NFETS and over extension regions of the first semiconductor material. The first inner spacers include positive charge or dipoles. Second inner spacers are formed on sidewalls of the gate structures of PFETS and over extension regions of the second semiconductor material. The second inner spacers include negative charge or dipoles. Source/drain regions are formed adjacent to the gate structures. Inversion layers are formed in the extension regions between the channel regions and the source/drain regions. The inversion layers are induced by the first and second inner spacers to form a conductive link between the channel regions and the source/drain regions.

A method for fabrication of field effect transistor device includes forming a gate structure over a channel region in a semiconductor material; forming an inner spacer on sidewalls of the gate structure and over an extension region of the semiconductor material, the inner spacer including charge or dipoles; forming a source/drain region adjacent to the gate structure; and inducing an inversion layer in the extension region using the inner spacer to form an conductive link between the channel region and the source/drain region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, complementary metal oxide semiconductor (CMOS) devices include high mobility channels that are linked or connected to source/drain (S/D) regions without employing extension regions. In one particularly useful embodiment, S/D regions may be in-situ doped, and dopant implantation may be removed altogether. In useful embodiments, CMOS integration may include different substrate/channel materials for n-type field effect transistors (NFETs) and p-type field effect transistors (PFETs). Material differences between NFETs and PFETs may be needed for continued size scaling of integrated circuits. In one embodiment, III-V materials may be employed for NFET channels and (Si)Ge for PFET channels on the same device. III-V materials may include, e.g., InGaAs, GaAs, InP, GaInP, AlGaAs, etc. (Si)Ge includes silicon doped Ge; however, the amount of Si may be varied to include SiGe with a high Ge content or a high Si content.

The present principles provide structures and materials to link high mobility channels (e.g., InGaAs for NFETs and (Si)Ge for PFETs) and in-situ doped S/D regions without relying on dopant implantation. III-V materials and (Si)Ge materials are provided on or in a same substrate, and in-situ doped raised S/D structures are formed for both NFETs and PFETs. The electrical link between the channels and S/D regions is provided by fixed charge or dipoles embedded in spacers adjacent to gates. The charge or dipoles may be present in the materials selected for the spacers. For example, pre-existing fixed charge and/or dipoles may be intrinsic to the spacer materials employed. Therefore, no additional processing is needed to introduce charge except for the case where one material is converted to another, e.g., $HfO_2$ (for PFETs) converted to HfON (for NFETs) via nitridation. The charger density may include charge in the range of about $1 \times 10^{12}$ to about $1 \times 10^{14}/cm^2$.

The spacers induce an inversion layer in the substrate in contact with the spacer. The inversion layer reduces any barrier to conduction and permits charge flow to form the electrical link. The NFET spacer may include an inner layer having positive fixed charge or electric dipoles having equivalent effects and an optional outer layer to protect the inner layer during S/D epitaxial growth. The inner NFET spacer may include dielectric materials with a dielectric constant (k-value) greater than that of SiN (e.g., k≥~7), oxides of the lanthanide series (e.g., La, Lu, etc.), oxides of alkaline earth metals (e.g., MgO), HfON, etc. The outer NFET spacer may include, e.g., SiN.

The PFET spacer may include an inner layer having negative fixed charge or electric dipoles having equivalent effects and an optional outer layer to protect the layer during S/D epitaxial growth. The inner PFET spacer may include dielectric materials with a k-value greater than that of SiN (e.g., k≥~7), $Al_2O_3$, $TiO_2$, $HfO_2$, etc. The outer PFET spacer may include, e.g., SiN.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs or SiGe. These compounds include different proportions of the elements within the compound, e.g., InGaAs includes $In_x Ga_{1-x} As$, where x is less than or equal to 1, or SiGe includes $Si_x Ge_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
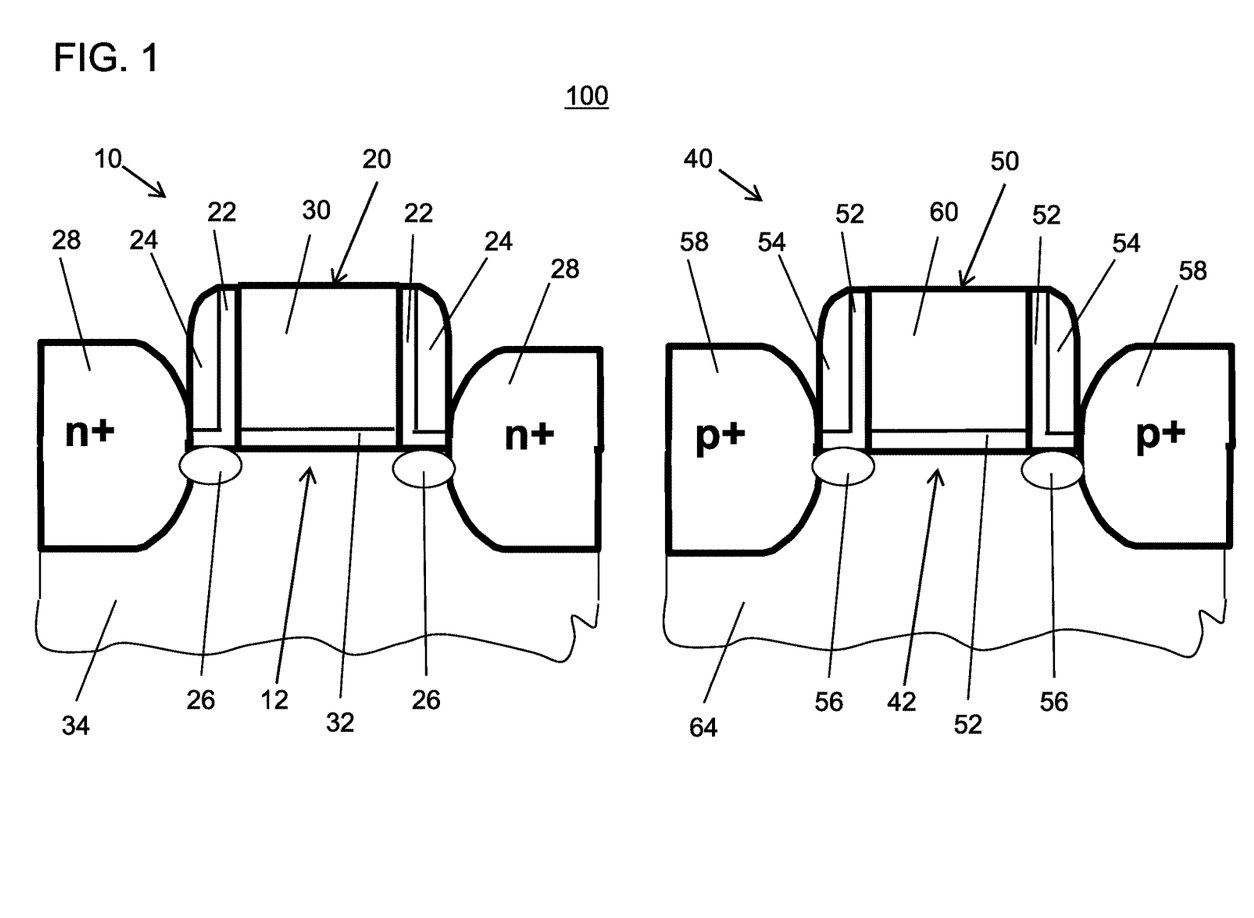
FIG. 1 is a cross-sectional view of a complementary metal oxide semiconductor (CMOS) device having charged inner spacers to induce inversion layers to form a channel link in accordance with the present principles.

Referring now to the drawings in which like numerals represent the same or similar elements and initially to FIG. 1, a CMOS device 100 is shown in cross-section in accordance with one illustrative embodiment. The CMOS device 100 includes NFETs 10 and PFETs 40, each on a different substrate material. The NFET 10 is formed on a substrate material 34, which preferably includes a III-V material, such as, e.g., InGaAs, GaAs, AlGaAs, InGaP, InP, or other suitable materials, especially for high charge mobility devices. The PFET 40 is formed on a substrate material 44, which preferably includes a Si or Ge material, and in particularly useful embodiments includes SiGe or other suitable material for high charge mobility devices.

A gate structure 20 of the NFET device 10 includes a gate dielectric 32 and a gate conductor 30. The gate dielectric 32 may include a high-k dielectric material, such as $HfO_2$, although other suitable gate dielectrics may be employed. The gate conductor 30 may include any suitable conductor, such as W, Ti, TiN, TiC, Al, etc. The gate structure 20 includes an inner spacer 22 and an optional outer spacer 24.

In one embodiment, the NFET spacer 22, 24 is formed separately from the PFET spacer 52, 54 and includes different materials. In another embodiment, NFET and PFET spacers are formed using a same material that is processed differently for each device type.

The inner spacer 22 of the NFET 10 includes a positive fixed charge or electric dipoles having equivalent effects. The outer spacer 24 may be formed to protect the inner spacer 22 during S/D epitaxial growth. The inner spacer 22 may include dielectric materials with a k-value greater than that of SiN (e.g., k≥~7), e.g., oxides of the lanthanide series (e.g., La, Lu, etc.), oxides of alkaline earth metals (e.g., MgO), HfON, etc. The outer spacer 24 may include, e.g., SiN.

The inner spacer 22 includes positive fixed charge or dipoles by material selection or may be doped during formation to increase the positive charge in the inner spacer 22. The positive charge (or dipoles) in the inner spacer 22 induce an electron inversion layer 26 in the substrate 34 (in a channel 12 of the NFET 10). The electron inversion layer 26 provides an electrical link or connection to S/D regions 28 formed adjacent to the spacer 22, 24. In this case, the S/D regions 28 are n+ doped. The doping of the S/D regions 28 is preferably performed during formation (in-situ doping). In this way, no implanting or external doping (no extension doping) is needed in the high mobility channel region 12. This results in a higher quality channel and preserves the high charge mobility needed.

A gate structure 50 of the PFET device 40 includes a gate dielectric 62 and a gate conductor 60. The gate dielectric 62 may include a high-k dielectric material, such as $HfO_2$, although other suitable gate dielectrics may be employed. The gate conductor 60 may include any suitable conductor, such as W, Ti, TiN, TiC, Al, etc. The gate structure 50 includes an inner spacer 52 and an optional outer spacer 54.

In one embodiment, the PFET spacer 52, 54 is formed separately from the NFET spacer 22, 24 and includes different materials. In another embodiment, NFET and PFET spacers are formed using a same material that is processed differently. For example, in one embodiment, the spacers 22 and 52 may be formed with a deposition of $HfO_2$, and the spacer of the NFET 10 is subjected to a selective nitridation process of the $HfO_2$ to form HfON to create more positive fixed charge. The nitridation may be performed via plasma nitridation or nitrogen implantation. The spacer 52 of the PFET 40 may be blocked during the nitridation processing of the spacer 22.

The inner spacer 52 of the PFET 40 includes a negative fixed charge or electric dipoles having equivalent effects. The outer spacer 54 may be formed to protect the inner spacer 52 during S/D epitaxial growth. The inner spacer 52 may include dielectric materials with a k-value greater than that of SiN (e.g., k≥~7), e.g., $Al_2O_3$, $TiO_2$, $HfO_2$, etc. The outer spacer 54 may include, e.g., SiN.

The inner spacer 52 includes negative fixed charge or dipoles by material selection or may be doped during formation to increase the negative charge in the inner spacer 52. The negative charge (or dipoles) in the inner spacer 52 induce a hole inversion layer 56 in the substrate 64 (in a channel 42 of the PFET 40). The hole inversion layer 56 provides an electrical link or connection to S/D regions 58 formed adjacent to the spacer 52, 54. In this case, the S/D regions 58 are p+ doped. The doping of the S/D regions 58 is preferably performed during formation (in-situ doping). In this way, no implanting or external doping (no extension doping) is needed in the high mobility channel region 42. This results in a higher quality channel and preserves the high charge mobility needed.

The present principles may be formed using different processing techniques, e.g., FIG. 1 shows planar gate-first structures; however, the present principles are applicable to any device structure. For example, the present principles are applicable to 3-D structures (e.g., finFET, nanowires, etc.), gate-last process structures, etc.

Figure 2:
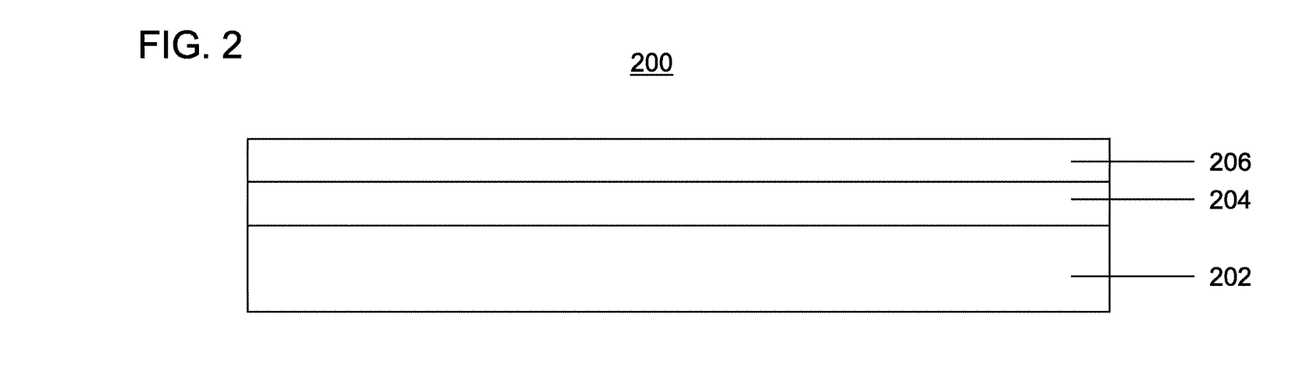
FIG. 2 is a cross-sectional view of a substrate that provides different substrate material in accordance with one illustrative embodiment.

Referring to FIG. 2, a semiconductor-on-insulator substrate (SOI) 200 is shown in accordance with one illustrative embodiment. The present principles include CMOS technology and preferably employ different substrate materials for NFETs and PFETs. In one embodiment, SiGe may be grown on III-V material or III-V material may be grown on SiGe. However, such growth may need interstitial buffer layers to handle lattice mismatches between the different materials. While such an approach is contemplated by the present principles, the SOI substrate 200 may be employed to provide two types of defect-free monocrystalline materials. The SOI substrate 200 includes a bulk substrate material 202, a buried dielectric layer 204 and a semiconductor layer 206. The bulk substrate material 202 may include a III-V material while the semiconductor layer 206 may include SiGe, or vice versa. For purposes of explanation, the bulk substrate material 202 includes III-V material for an NFET while the semiconductor layer 206 includes SiGe for a PFET. The buried dielectric layer 204 may include an oxide, although other dielectric materials may be employed.

Figure 3:
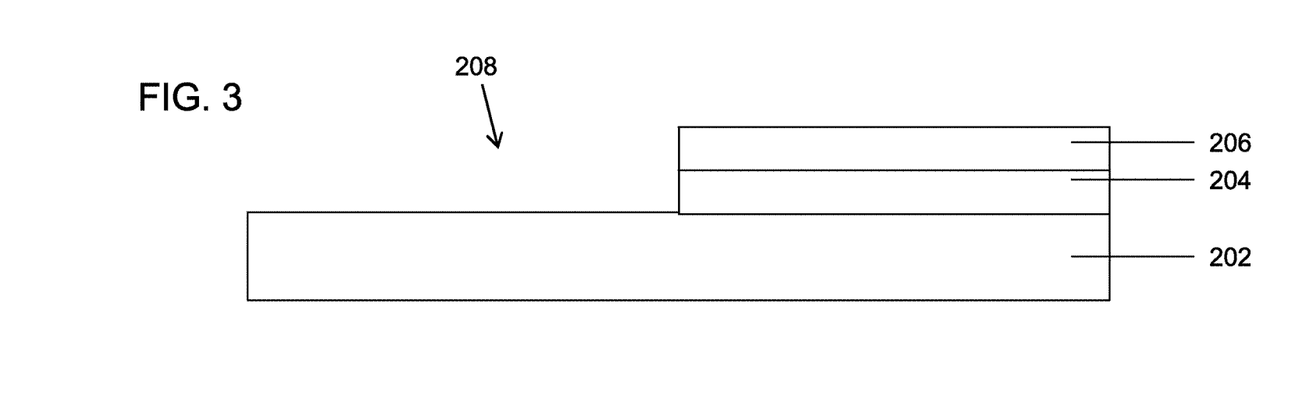
FIG. 3 is a cross-sectional view of the substrate of FIG. 2 showing a bulk substrate exposed in accordance with the present principles.

Referring to FIG. 3, a lithography process may be performed to expose a portion of the bulk substrate 202 for NFET processing. The semiconductor layer 206 is protected during an etching process to remove both the semiconductor layer 206 and the buried dielectric layer 204 from the NFET area. In one embodiment, the semiconductor layer 206 and the bulk substrate 202 may be processed to form three-dimensional structures like fins or nanowires. However, the present embodiment will be described in terms of planar field effect transistors.

Figure 4:
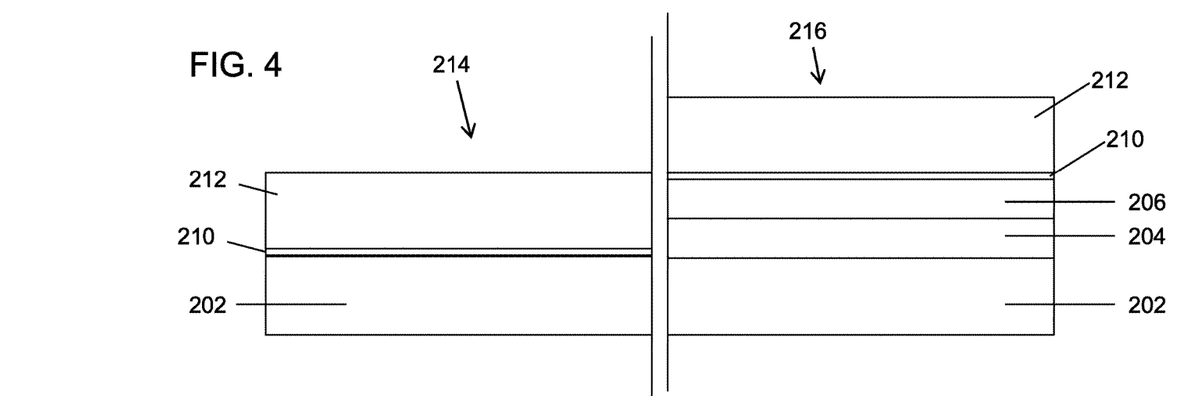
FIG. 4 is a cross-sectional view of the substrate of FIG. 3 showing a gate dielectric and gate conductor formed in accordance with the present principles.

Referring to FIG. 4, a gate dielectric 210 is deposited in an NFET area 214 and in a PFET area 216. The gate dielectric layer 210 may include a high-k dielectric material (e.g., $HfO_2$, or the like), although other suitable dielectric materials may be employed. A gate conductor 212 is formed in a gate-first process. The gate conductor 212 may include, e.g., W, Al, Ti, TiN, TiC, etc. As noted, the gate conductor 212 may instead include dummy gate material employed for a gate-last process. Also, the gate conductor 212 may include one or more different metal materials (e.g., a work function metal and main conductor).

Figure 5:
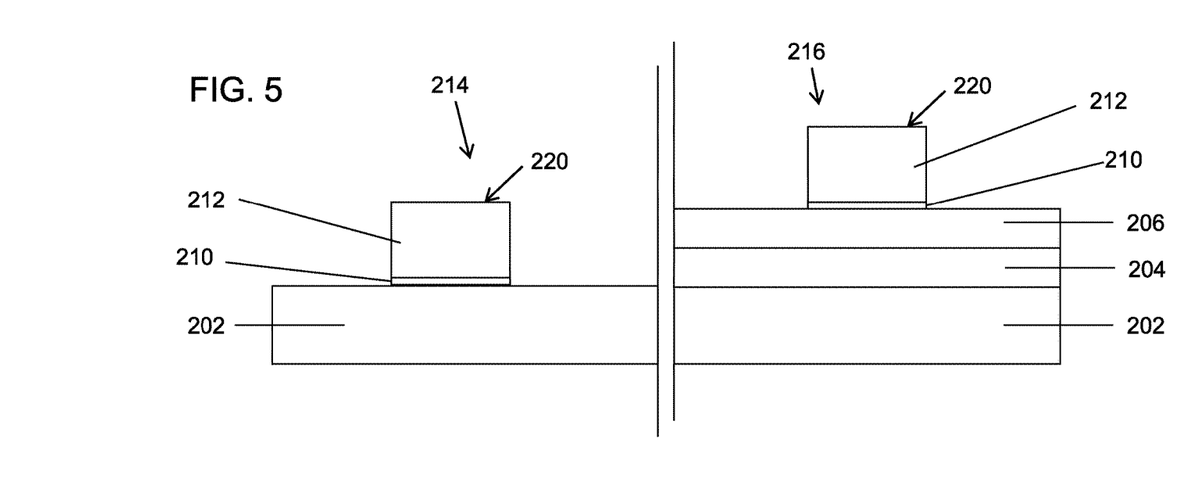
FIG. 5 is a cross-sectional view of the substrate of FIG. 4 showing the gate dielectric and gate conductor patterned to form gate structures in accordance with the present principles.

Referring to FIG. 5, gate structures 220 are patterned in the NFET area 214 and in the PFET area 216. The gate structures 220 may be formed using a lithographic mask and etch process. The etch process may include a reactive ion etch (RIE).

Figure 6:
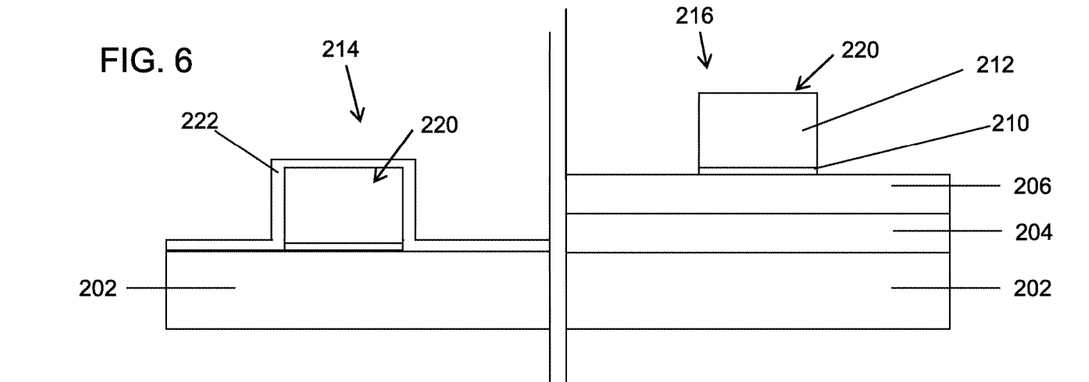
FIG. 6 is a cross-sectional view of the substrate of FIG. 5 showing a first inner spacer layer formed in accordance with one embodiment.

Referring to FIG. 6, an inner spacer layer 222 is formed in the NFET area 214. The inner spacer layer 222 may be deposited only in the NFET area 214 or may be deposited across the NFET area 214 and the PFET area 216 and then removed from the PFET area 216. In one embodiment, the inner spacer layer 222 is deposited across the NFET area 214 and the PFET area 216 from a same material and then treated or processed differently to apply the appropriate charge or dipole for forming inversion layers in the corresponding substrate region.

When processing one of the NFET area 214 or the PFET area 216, the other of the PFET area 216 and the NFET area 214 can be blocked by a blocking layer (not shown). The blocking layer or layers may include a thin dielectric material or resist to protect the covered portion during processing of other areas of the device.

The inner spacer layer 222 may include a material having a positive fixed charge or electric dipoles having equivalent effects. The inner spacer layer 222 may include dielectric materials with a k-value greater than that of SiN (e.g., k≥~7), e.g., oxides of the lanthanide series (e.g., La, Lu, etc.), oxides of alkaline earth metals (e.g., MgO), HfON, etc. If HfON is employed, the inner spacer layer 222 is deposited as $HfO_2$ in the NFET area 214 and the PFET area 216, and then subjected to a selective nitridation of the $HfO_2$ in the NFET area 214 to create more positive fixed charge. The nitridation may be performed via plasma nitridation or nitrogen implantation. The PFET area 216 is protected from the nitridation process and remains as $HfO_2$.

Figure 7:
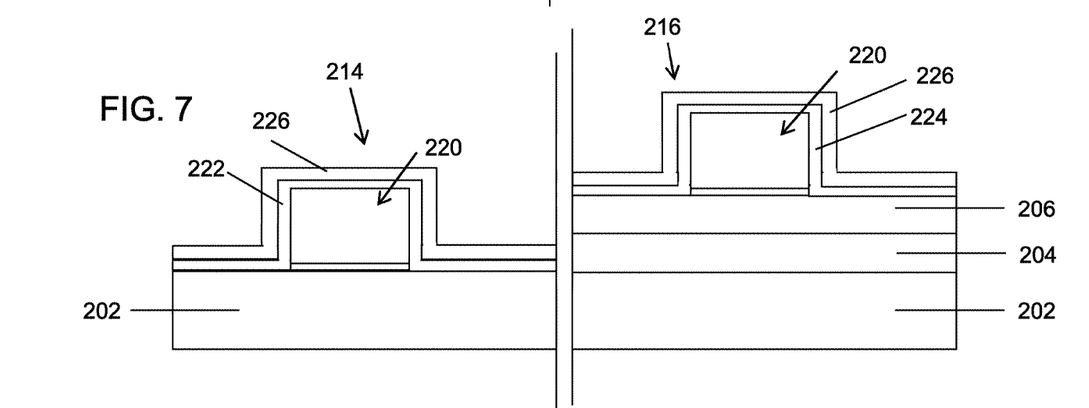
FIG. 7 is a cross-sectional view of the substrate of FIG. 6 showing first and second inner spacer layers formed and an outer spacer layer formed in accordance with one embodiment.

Referring to FIG. 7, an inner spacer layer 224 is formed in the PFET area 216 (if formed from a different material than the NFET area 214 inner spacer 222). It should be noted that, in some embodiments, the inner spacer 224 may be formed before the inner spacer 222. In other embodiments, the inner spacer layer 224 may be deposited only in the PFET area 214 or may be deposited across the NFET area 214 and the PFET area 216 and then removed from the NFET area 214. When processing one of the NFET area 214 or the PFET area 216, the other of the PFET area 216 and the NFET area 214 can be blocked by a blocking layer (not shown).

The inner spacer layer 224 may include a material having a negative fixed charge or electric dipoles having equivalent effects. The inner spacer layer 224 may include dielectric materials with a k-value greater than that of SiN (e.g., k≥~7), e.g., $Al_2O_3$, $TiO_2$, $HfO_2$, etc.

An outer spacer layer 226 may optionally be formed to protect the inner spacer 222, 224 during S/D epitaxial growth in later steps. The outer spacer 226 may include, e.g., SiN.

Figure 8:
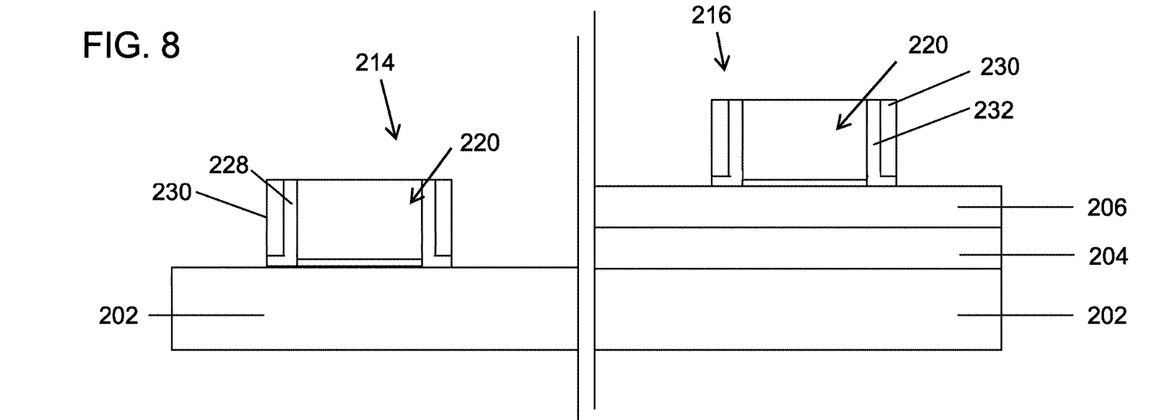
FIG. 8 is a cross-sectional view of the substrate of FIG. 7 showing first and second inner spacers and an outer spacer formed in accordance with one embodiment.

Referring to FIG. 8, a reactive ion etch (RIE) process is performed to remove horizontal portions of the inner spacer layers 222, 224 and outer spacer layer 226. This forms inner spacer 228 in the NFET area 214 and inner spacer 232 in the PFET area 216. An outer spacer 230 may be formed in both the NFET area 214 and the PFET area 216.

Figure 9:
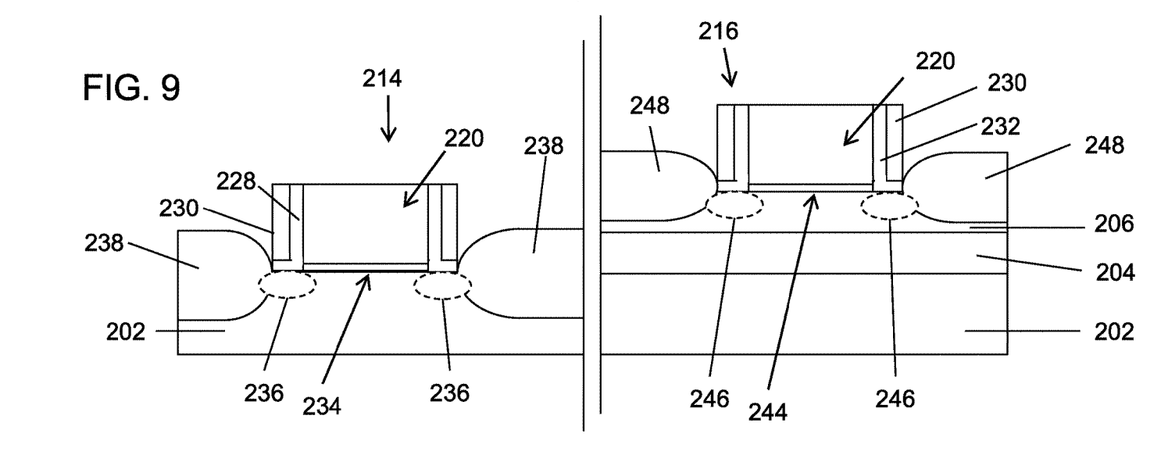
FIG. 9 is a cross-sectional view of the substrate of FIG. 8 showing source and drain regions formed and inversion layers formed as induced by the first and second inner spacers in accordance with one embodiment.

Referring to FIG. 9, S/D regions 238 are formed using an epitaxial growth process, such as molecular beam epitaxy (MBE) or metal organic chemical vapor deposition (MOCVD). S/D regions 238 are preferably doped in-situ (n+ doped). In this way, no doping processes need to be performed to create channel extension regions.

The inner spacer 228 includes the positive fixed charge or dipoles by material selection or may be doped during formation to increase the positive charge in the inner spacer 228. The positive charge (or dipoles) in the inner spacer 228 induces an electron inversion layer 236 in a channel region 234 for NFETs. The electron inversion layer 236 provides an electrical link or connection to S/D regions 238 formed adjacent to the spacer 228. The doping of the S/D regions 238 is preferably performed during formation (in-situ doping). In this way, no implanting or external doping (no extension doping) is needed in the high mobility channel region 234. This results in a higher quality channel and preserves the high charge mobility needed.

S/D regions 248 are formed using an epitaxial growth process, such as molecular beam epitaxy (MBE) or metal organic chemical vapor deposition (MOCVD). S/D regions 248 are preferably doped in-situ (p+ doped). In this way, no doping processes need to be performed to create channel extension regions. The S/D regions 238 and 248 are formed separately since different material or dopants are employed, especially if these regions are doped in-situ.

The inner spacer 232 includes the negative fixed charge or dipoles by material selection or may be doped during formation to increase the negative charge in the inner spacer 232. The negative charge (or dipoles) in the inner spacer 232 induces a hole inversion layer 246 in a channel region 244 for PFETs. The hole inversion layer 246 provides an electrical link or connection to S/D regions 248 formed adjacent to the spacer 232. The doping of the S/D regions 248 is preferably performed during formation (in-situ doping). In this way, no implanting or external doping (no extension doping) is needed in the high mobility channel region 244. This results in a higher quality channel and preserves the high charge mobility needed.

Figure 10:
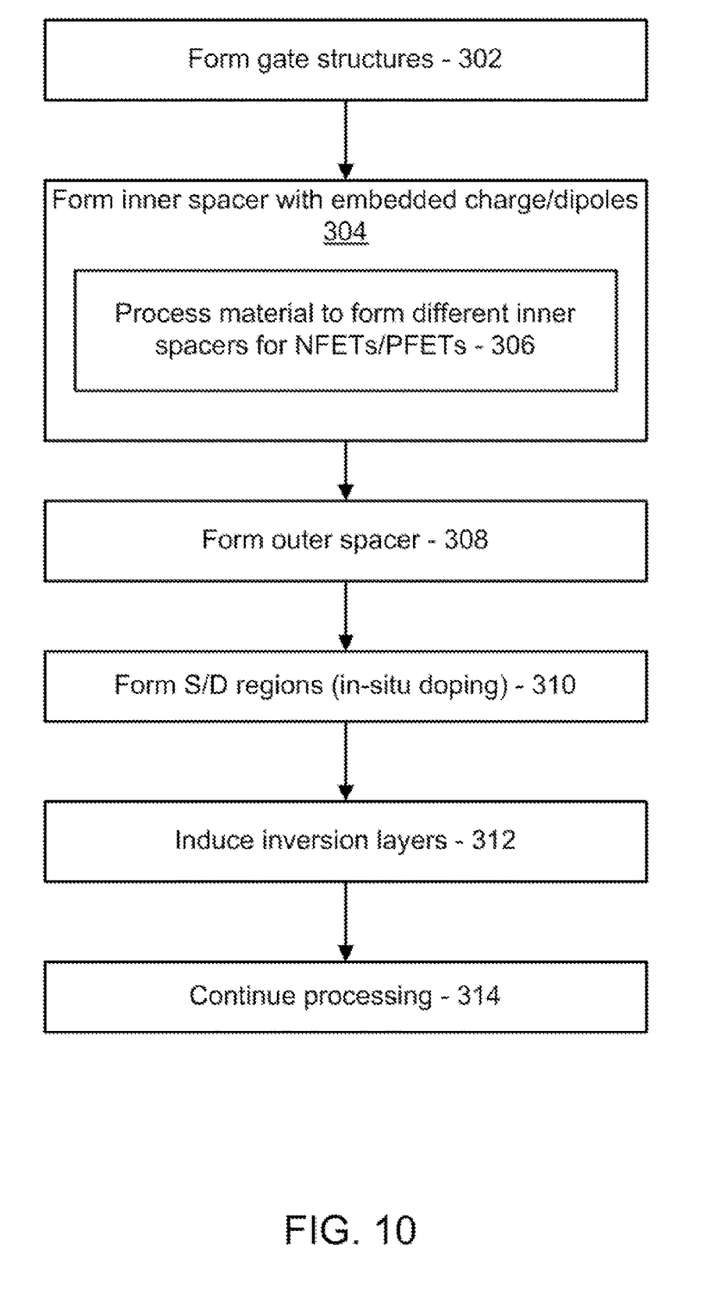
FIG. 10 is a block/flow diagram showing methods for forming a field effect transistor device in accordance with illustrative embodiments.

Referring to FIG. 10, a method for forming high mobility CMOS transistors is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a gate structure is formed over a channel region in a semiconductor material. In block 304, an inner spacer is formed on sidewalls of the gate structure and in an extension region of the semiconductor material. The inner spacer includes charge or dipoles. In useful embodiments, the inner spacer includes positive charge or dipoles and the inversion layer includes an electron inversion layer for NFETs formed from one of an oxide of the lanthanide series, an oxide of an alkaline earth metals or HfON. The inner spacer includes negative charge or dipoles and the inversion layer includes a hole inversion layer for PFETs formed from one of $Al_2O_3$, $TiO_2$, or $HfO_2$ for a p-type field effect transistor.

In block 306, the inner spacer may include a single material over gate structures of NFETs and PFETs, which is processed to provide the needed charge type material. In one example, $HfO_2$ is deposited over gate structures of NFETs and PFETs, and a nitridation process is performed to form HfON on the NFET inner spacer.

In block 308, an outer spacer(s) may be formed on PFETs and NFETs. In block 310, S/D regions are formed adjacent to the gate structure. The S/D regions may be formed with in-situ doping to avoid dopant processing in the extension region (and/or the channel region). In one embodiment, the device is formed without dopant implantation at all to preserve the channel region for high mobility operation.

In block 312, an inversion layer is induced in the extension region using the inner spacer to form a conductive link between the channel region and the source/drain region. The charge formed in the inner spacer creates the inversion regions to increase conductivity in what would otherwise be a dead zone below the spacer dielectric (where no gate conductor is present). In block 314, processing continues to complete the device(s) including forming interlevel dielectric layers, contacts, metallizations, etc.

Having described preferred embodiments for a high-k spacer for extension-free CMOS devices with high mobility channel materials (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A field effect transistor device, comprising:
   a gate structure formed over a channel region in a semiconductor material;
   an inner spacer formed directly on sidewalls of the gate structure and over an extension region of the semiconductor material, where the inner spacer is a dielectric material with a dielectric constant greater than about 7, and the inner spacer including charge or dipoles;
   a source/drain region formed adjacent to the gate structure; and
   an inversion layer formed in the extension region induced by the inner spacer to form a conductive link between the channel region and the source/drain region.

2. The device as recited in claim 1, further comprising an outer spacer formed on the inner spacer.

3. The device as recited in claim 1, wherein the inner spacer includes one of an oxide of the lanthanide series, an oxide of an alkaline earth metals or HfON for an n-type field effect transistor.

4. The device as recited in claim 1, wherein the inner spacer includes one of $Al_2O_3$, $TiO_2$, or $HfO_2$ for a p-type field effect transistor.

5. The device as recited in claim 1, wherein the source/drain region includes an in-situ doped region to avoid dopant processing in the extension region and the channel region.

6. The device as recited in claim 1, wherein the transistor includes a complementary metal oxide semiconductor (CMOS) device and the semiconductor material includes a first semiconductor layer for forming n-type field effect transistors (NFETs) and a second semiconductor layer for forming p-type field effect transistors (PFETs).

7. The device as recited in claim 6, wherein the first semiconductor layer includes a III-V material and the second semiconductor layer includes SiGe.

8. The device as recited in claim 1, wherein the inner spacer includes positive charge or dipoles and the inversion layer includes an electron inversion layer for n-type field effect transistors.

9. The device as recited in claim 1, wherein the inner spacer includes negative charge or dipoles and the inversion layer includes a hole inversion layer for p-type field effect transistors.

10. A field effect transistor device, comprising:
    a complementary metal oxide semiconductor (CMOS) device having a first semiconductor material for forming n-type field effect transistors (NFETs) and a second semiconductor material for forming p-type field effect transistors (PFETs), the first and second semiconductor materials being formed from different materials on a same substrate;
    gate structures formed over channel regions in the first and second semiconductor materials;
    first inner spacers formed directly on sidewalls of the gate structures of NFETS and over extension regions of the first semiconductor material, the first inner spacers including positive charge or dipoles;
    second inner spacers formed directly on sidewalk of the gate structures of PFETS and over extension regions of the second semiconductor material, the second inner spacers including negative charge or dipoles, wherein the first and second inner spacers include a dielectric material with a dielectric constant greater than about 7;
    source/drain regions formed adjacent to the gate structures; and
    inversion layers formed in the extension regions between the channel regions and the source/drain regions, the inversion layers being induced by the first and second inner spacers to form a conductive link between the channel regions and the source/drain regions.

11. The device as recited in claim 10, further comprising an outer spacer formed on the first and second inner spacers.

12. The device as recited in claim 10, wherein the first inner spacers include one of an oxide of the lanthanide series, an oxide of an alkaline earth metals or HfON for an n-type field effect transistor.

13. The device as recited in claim 10, wherein the second inner spacers include one of $Al_2O_3$, $TiO_2$, or $HfO_2$ for a p-type field effect transistor.

14. The device as recited in claim 10, wherein the source/drain regions include situ doped regions to avoid dopant processing in the extension region and the channel region.

15. The transistor as recited in claim 10, wherein the first semiconductor material includes a III-V material and the second semiconductor material includes SiGe.

* * * * *